United States Patent [19]
Katsu et al.

[11] Patent Number: 4,883,985
[45] Date of Patent: Nov. 28, 1989

[54] MESFET LATCH CIRCUIT

[75] Inventors: Shin Katsu, Takatsuki; Shutaro Nambu, Ibaraki; Akio Shimano, Osaka, all of Japan

[73] Assignee: Matsushita Electric Industrial Co., Ltd., Kadoma, Japan

[21] Appl. No.: 117,367

[22] Filed: Oct. 28, 1987

Related U.S. Application Data

[63] Continuation of Ser. No. 821,889, Jan. 27, 1986, abandoned, which is a continuation of Ser. No. 458,023, Jan. 14, 1983, abandoned.

[30] Foreign Application Priority Data

| Jan. 20, 1982 | [JP] | Japan | 57-8119 |
| Feb. 16, 1982 | [JP] | Japan | 57-23802 |
| Feb. 16, 1982 | [JP] | Japan | 57-23803 |
| May 11, 1982 | [JP] | Japan | 57-79349 |

[51] Int. Cl.$^4$ .................... H03K 3/26; H03K 19/017
[52] U.S. Cl. .................... 307/279; 307/448; 307/272.1; 307/291
[58] Field of Search .......... 307/279, 291, 530, 289, 307/272.1, 450, 448, 481; 365/154, 156, 205, 207, 208, 190

[56] References Cited

U.S. PATENT DOCUMENTS

| 3,500,064 | 3/1970 | Wong | 307/279 |
| 3,560,764 | 2/1971 | McDowell | 307/279 |
| 3,949,381 | 4/1976 | Dennard et al. | 307/279 |
| 3,955,182 | 5/1976 | Bert | 307/291 |
| 3,982,140 | 9/1976 | Lockwood | 307/279 |
| 3,983,412 | 9/1976 | Roberts et al. | 307/279 |
| 4,021,686 | 5/1977 | Zuk | 307/53 |
| 4,195,239 | 3/1980 | Suzuki | 307/279 |
| 4,229,668 | 10/1980 | Ebihara et al. | 307/279 |
| 4,247,915 | 1/1981 | Bartlett | 307/279 |
| 4,253,163 | 2/1981 | Komoriya et al. | 365/207 |
| 4,300,060 | 11/1981 | Yu | 307/272 A |
| 4,320,312 | 3/1982 | Walker et al. | 307/279 |
| 4,333,020 | 6/1982 | Maeder | 307/291 |
| 4,375,677 | 3/1983 | Schuermeyer | 307/279 |
| 4,393,315 | 7/1983 | Stickel et al. | 307/264 |
| 4,410,815 | 10/1983 | Ransom et al. | 307/448 |
| 4,712,022 | 12/1987 | Vu | 307/450 |

OTHER PUBLICATIONS

Katsu et al., "GaAs Monolithic Frequency Divider Using Source Coupled FET Logic", IEE Elec. Devices Letters, vol. EDL-3, No. 8, Aug. 82, pp. 197–199.
Chu et al., "Low-Power, High-Speed Sense Latch", IBM Tech. Discl. vol. 17, No. 9, Feb. 75, pp. 2582–2583.
Rock, "Threshold Compensated FET Latch Circuit" IBM Tech. Disc. Bulletin, vol. 18, No. 11, Apr. 1976, pp. 3593–3594.

Primary Examiner—Stanley D. Miller
Assistant Examiner—Timothy P. Callahan
Attorney, Agent, or Firm—Cushman, Darby & Cushman

[57] ABSTRACT

An FET circuit suitable for a latch has a pair of inverters. The input stage FET of each of the inverters is connected such that the gate electrode thereof is connected to receive an output signal of the FET of the other inverter through a circuit having an FET and at least a diode. The sources of the input stage FETs are connected to a common connection point, and a current source arrangement such as a resistor is connected between the common connection point and a power supply terminal. The circuit provides an extended allowable range of the effective threshold voltage $V_T$ and has small power consumption.

11 Claims, 8 Drawing Sheets

MESFET LATCH CIRCUIT

This is a continuation of application Ser. No. 821,889, filed Jan. 27, 1986 which was abandoned upon the filing hereof, which was a continuation of Ser. No. 458,023 filed Jan. 14, 1983, now abandoned.

BACKGROUND OF THE INVENTION

1. Field of the Invention:

The present invention relates to FET circuits, and more particularly metal semiconductor field effect transistors (hereinafter referred to as MESFET) constituting a latch circuit.

2. Description of the Prior Art:

FIG. 1 shows a conventional latch comprising normally-off type MESFETs wherein threshold voltage $V_T$ of the MESFETs is positive. As shown in FIG. 1, the conventional latch has a pair of MESFETs $Q_{11}$ and $Q_{12}$ which are connected by their common sources to a grounding terminal 12, by their drains through respective resistors $R_{11}$ and $R_{12}$ to a positive power supply terminal 11, and by their gate electrodes to the drain electrode of the other MESFETs $Q_{12}$ and $Q_{11}$, respectively. Output terminals 13 and 14 are connected to the drains of the MESFETs $Q_{11}$ and $Q_{12}$, respectively. In this latch circuit, in order that "H" level and "L" level are issued at the output terminals 13 and 14, respectively, or vice versa, it is necessary that one of the MESFET $Q_{11}$ or $Q_{12}$ becomes sufficiently on and the other one becomes off or approximately off. Provided that the threshold voltage of the MESFETs of $Q_{11}$ and $Q_{12}$ are $V_T$, and the drain-source current of the on-state is $I_{ON}$, then for a state of MESFET $Q_{11}$ being on a "L" level, voltage $V_L$ becomes $$V_L = V_{DD} - I_{ON} \cdot R_{11} \tag{1}$$

At this time, the voltage $V_L$ is the gate input voltage of the MESFET $Q_{12}$, and in order to change the MESFET $Q_{12}$ to its off state, the below-mentioned relation is necessary:

$$V_L < V_T \tag{2}$$

In a similar manner, a "H" level voltage $V_H$ at the output terminal 14 is $V_{DD}$ at this time, or becomes $V_{DI}$ for a case where the power supply voltage $V_{DD}$ is higher than Schottky barrier voltage $V_{DI}$, and in order to make the MESFET $Q_{11}$ on by the $V_H$ voltage at the output terminal 14 the next relation is necessary:

$$V_H > V_T \tag{3}$$

In this circuit if the threshold voltage $V_T$ decreases, the on current $I_{ON}$ increases, and therefore the "L" level voltage $V_L$ decreases. However, since the threshold voltage $V_T$ has decreased, the above-mentioned relation of inequity (2) holds only for a very limited range of the threshold voltage $V_T$. When the threshold voltage $V_T$ increases, similarly the relation of the inequity (2) holds only foe a small range of the threshold voltage $V_T$.

Detailed analysis of the above-mentioned relation has been made by circuit simulation by using a computer, and the simulated results are shown in the graph of FIG. 2, wherein curves $V_H$ and $V_L$ show "H" level voltage and "L" level voltage, respectively, and a line $V_C$ shows voltages of the output terminals 13 and 14 when they become equal instead of being stabilized to "H" level or "L" level by the latching action, i.e., critical voltages to divide the "H" level and "L" level. Differences of this critical voltage and the "H" level or "L" level, namely $V_H - V_C$, $V_C - V_L$, are noise margins for latch stabilization.

From observation of the graph of FIG. 2, allowable range of the threshold voltage $V_T$ is about 0.1 to 0.2 volt. Accordingly, deviation $\Delta V_T$ of the threshold voltage $V_T$ is allowed only a range of ±50 mV. This ±50 mV deviation corresponds to very accurate controlling of ±40Å of a 1000Å thick channel layer when the MESFET is made with a GaAs substrate and carrier concentration of a channel layer is $10^{17}$ cm$^{-3}$. Such very accurate controlling of the thickness is practically impossible when such logic circuits are manufactured with a high integration with a high manufacturing yield.

FIG. 3 shows another conventional example of a latch using normally-on type MESFETs having a negative threshold voltage. MESFETs $Q_{31}$ and $Q_{32}$ correspond to MESFETs $Q_{11}$ and $Q_{12}$ of FIG. 1 and resistors $R_{31}$ and $R_{32}$ correspond to resistors $R_{11}$ and $R_{12}$ of FIG. 1, respectively. In this circuit of FIG. 3 there are two additional MESFETs $Q_{33}$ and $Q_{34}$ which are connected by their gates to the drains of the MESFETs $Q_{31}$ and $Q_{32}$, respectively, and by their sources through diodes $D_{31}$, $D_{32}$ and $D_{33}$ to the output terminal 33 and through diodes $D_{34}$, $D_{35}$ and $D_{36}$ to the output terminal 34, respectively, and by their drains commonly to a power supply terminal 31. This circuit has two negative power supply terminals, namely a first negative power supply terminal 32 corresponding to 12 of FIG. 1 and another negative power supply terminal 35 to which load resistors $R_{33}$ and $R_{34}$ of the source-follower MESFETs $Q_{33}$ and $Q_{34}$ are commonly connected. The diodes $D_{31}$ to $D_{33}$ and $D_{34}$ to $D_{36}$ are for leveling down source follower outputs so as to meet the input levels.

Generally, normally-on a type MESFET has an advantage of providing a larger on-current than a normally-off type MESFET as shown in FIG. 4 and in the circuit of FIG. 3. By this large on-current, logic swing of the circuit is expanded thereby resulting in increasing of allowable range of deviation of the threshold voltage $\Delta V_T$ to be 0.5 to 1.0 V. However, this conventional latch of FIG. 3 has a shortcoming of a large operating current and the necessity of many diodes for level adjustments of outputs and further necessitates two power supplies. Therefore, its power consumption is very large such that 10 to 100 times more power consumption is used than for the conventional normally-off type MESFET latch.

SUMMARY OF THE INVENTION

The present invention purports, in view of the above-mentioned shortcomings, to provide a latch having an extended allowable range of threshold voltage of the transistor which is effective for stable operation without increasing power consumption.

An FET circuit in accordance with the present invention comprises:

a pair of inverters, each inverter comprising an input-stage FET connected in a manner such that the gate electrode is connected to receive an output signal of the FET of the other inverter, the sources of the input-stage FETs being connected to a common-connection point, and current source means connected between the common-connect point and a power supply terminal.

DESCRIPTION OF THE PREFERRED EMBODIMENTS

Figure 1:
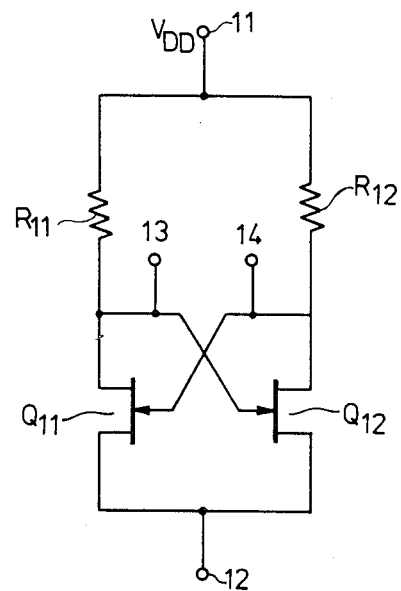
FIG. 1 is the circuit diagram of the conventional latch using normally-off type MESFETs.
Figure 2:
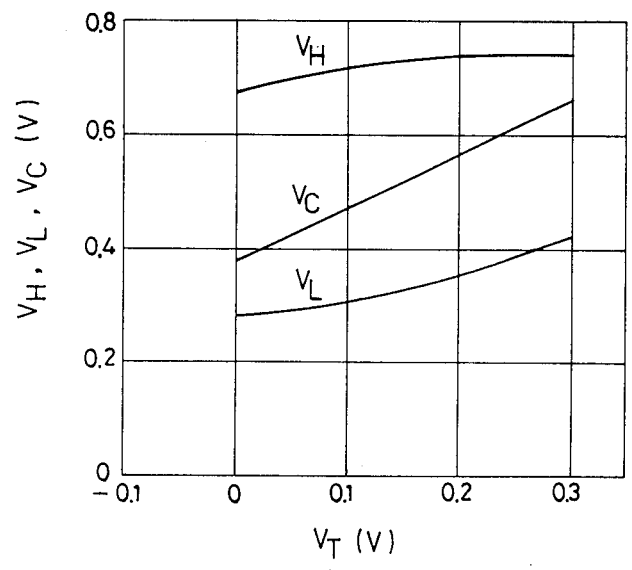
FIG. 2 is the graph showing the relation between threshold voltage of the MESFETs and operation of the circuit of FIG. 1.
Figure 3:
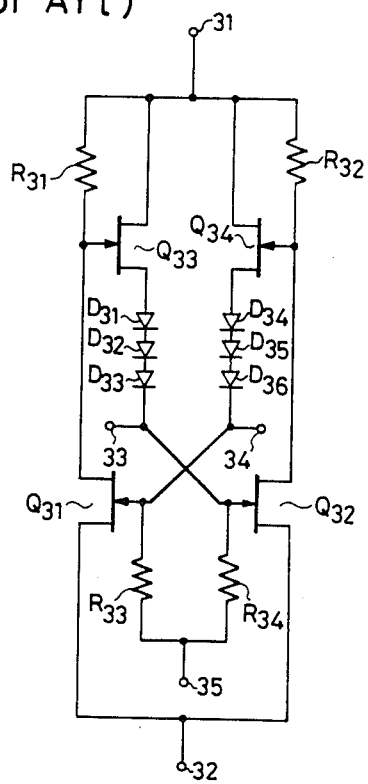
FIG. 3 is the circuit diagram of the second conventional latch using the normally-on type MESFETs.
Figure 4:
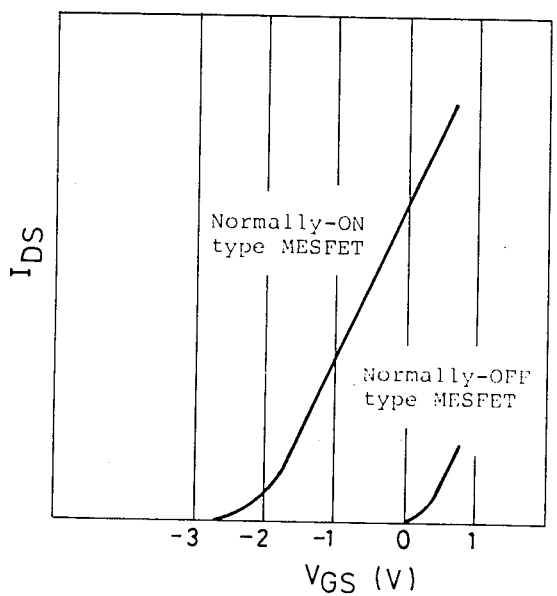
FIG. 4 is the graph showing the current-voltage characteristics of the normally-on type MESFETs and normally-off type MESFETs.
Figure 5:
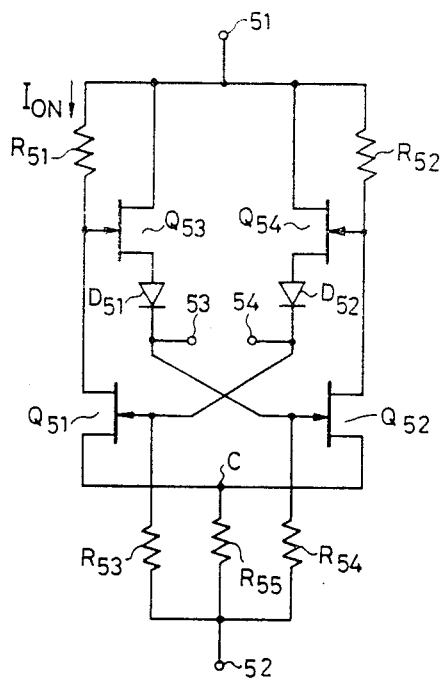
FIG. 5 is a circuit diagram of a first embodiment of a latch embodying the present invention.

The present invention is elucidated in detail referring to FIG. 5 and thereafter.

FIG. 5 shows a first example of a latch embodying the present invention. As shown in FIG. 5 the latch comprises a pair of inverters $Q_{51}+Q_{53}$ and $Q_{52}+Q_{54}$. Each of the inverters comprises input stage FET $Q_{51}$ or $Q_{52}$ which is connected by its gate electrode to the source of the source follower FET $Q_{54}$ or $Q_{53}$ through a diode $D_{52}$ or $D_{51}$ inbetween, respectively. The source follower FET $Q_{54}$ or $Q_{53}$ is connected by its gate to the drain of the input stage FET $Q_{52}$ or $Q_{51}$ and through a registor $R_{52}$ or $R_{51}$ to a positive side power supply terminal 51. The sources of the input stage FET $Q_{51}$ and $Q_{52}$ are connected in common to a common connected point C, and further a resistor $R_{55}$ as current source means is connected between common connected point C and the negative side power supply or ground terminal 52. Output terminals 53 and 54 are connected to junction points between the diode $D_{51}$ and the gate electrode of the FET $Q_{52}$ or to the junction point between the diode $D_{52}$ and the gate electrode of the FET $Q_{51}$, respectively, and the gate electrodes of the FET $Q_{51}$ and $Q_{52}$ are connected to the negative power supply terminal 52 through resistors $R_{53}$ and $R_{54}$, respectively. The resistors $R_{51}$ and $R_{52}$ are load resistors of the MESFETs $Q_{51}$ and $Q_{52}$, respectively, and resistors $R_{53}$ and $R_{54}$ are load resistors of the source follower MESFETs $Q_{54}$ and $Q_{53}$, respectively. The diodes $D_{51}$ and $D_{52}$ are for adjusting the input levels to the MESFETs $Q_{52}$ and $Q_{51}$, respectively. The output terminals 53 and 54 are of positive phase output and negative phase output, respectively.

Operation of the latch of FIG. 5 is as follows.

When a MESFET $Q_{51}$ is on and MESFET $Q_{52}$ is off, then "L" level voltage $V_L$ is as follows:

$$V_L = V_{DD} - I_{ON}R_{51} - V_{GS} - V_D \qquad (4).$$

Wherein $I_{on}$ is an on-current flowing through the resistor $R_{51}$,
$V_{GS}$ is gate-source voltage of the MESFET $Q_{53}$ and,
$V_D$ is voltage drop across the diode $D_{51}$.

At the same time "H" level voltage $V_H$ is as follows:

$$V_H = V_{DD} - V_{GS} - V_D \qquad (5).$$

So that the latch operates stably, to cut off the MESFET $Q_{52}$ by the "L" level voltage $V_L$ the following relation is necessary:

$$V_L < I_{ON}R_{55} + V_T \qquad (6).$$

Now, provided that the threshold voltages of the MESFETs decrease, then on-current $I_{ON}$ of the MESFET $Q_{51}$ increases, and the "L" level voltage $V_L$ decreases. Accordingly, when the resistor $R_{55}$ is large, then the above-mentioned inequality (6) holds for a wide range of the threshold voltage $V_T$, and the latch performs a stable operation.

Experimental and computer simulated study shows that D.C. resistance of the current source means $R_{55}$ should be selected to be 5–50 times of each source-drain resistance of the on-MESFET $Q_{51}$ and $Q_{52}$ in order for the latch to perform with good characteristics.

Figure 6:
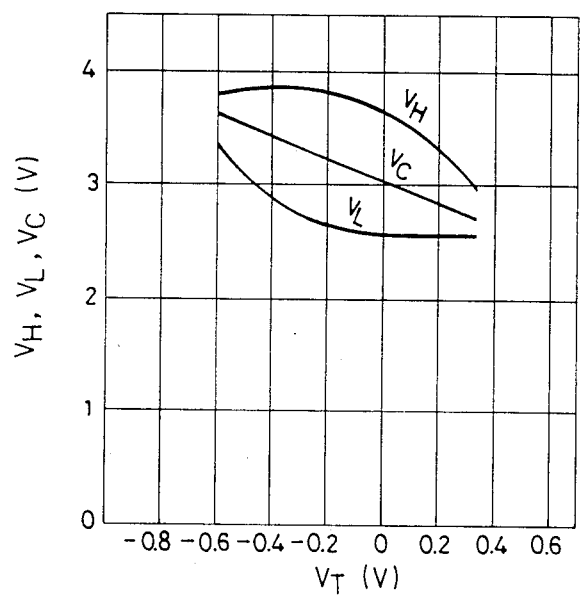
FIG. 6 is a graph showing a relation between threshold voltage and operation characteristic of the latch of FIG. 5.

FIG. 6 is a graph showing the allowable range of the threshold voltage $V_T$ of the MESFETs for performing normally as a latch, as simulated by computer. As shown by the curves, the latch performs stable operation for a wide range of the threshold voltage $V_T$ between $-0.6V$ and $0.3V$. Furthermore, when the resistor $R_{55}$ is sufficiently large, the critical voltage $V_C$ is always between the levels of "H" and "L", and accordingly the latch is very superior with respect to noise margin. Therefore, in this circuit the deviations of the threshold voltage $\Delta V_T$ of the MESFETs are allowed to be 0.9V; therefore difficulties of controlling of the threshold voltage in the manufacturing process of the MESFETs is greatly eased. Furthermore, with respect to the power consumption of the latch, very little power consumption, ½ to 1/10 times of the conventional latch using the normally-on type MESFETs, suffices to operate the latch in accordance with the present invention. Also, since the threshold voltage is around 0V and hence on-current is very small, only one pair of level shifting diodes $D_{51}$ and $D_{52}$ of one stage suffices, and a negative power supply is unnecessary.

Figure 7:
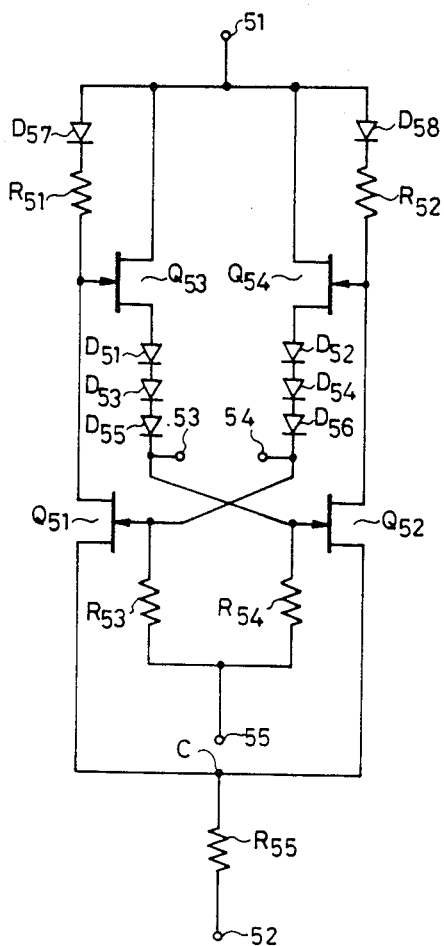
FIG. 7 is a circuit diagram of a second embodiment of latch embodying the present invention.

FIG. 7 shows a circuit diagram of a second example embodying the present invention. In this example, in order to increase allowable threshold voltage ranges of the plural stages of level shifting diodes $D_{51}$, $D_{53}$ and $D_{55}$ and $D_{52}$, $D_{54}$ and $D_{56}$ are used, and in order to increase the logic swing of the MESFETs $Q_{51}$ and $Q_{52}$ by increasing the on-currents by selecting the threshold voltage $V_T$ of the MESFETs $Q_{51}$ and $Q_{52}$ to be deeper, a second negative power supply terminal 55 is provided and a pair of resistors $R_{53}$ and $R_{54}$ are connected respectively from the gate electrodes of the MESFETs $Q_{51}$ and $Q_{52}$ to the common second negative power supply terminal 55. The level shifting diodes $D_{51}$ to $D_{56}$ should be selected to be of a desired number in order to meet desired input-output levels. The diodes $D_{57}$ and $D_{58}$, which are connected between respective resistors $R_{51}$ and $R_{52}$ and the positive power supply terminal 51, are for increasing operation characteristics of the MESFETs $Q_{53}$ and $Q_{54}$ so as to operate in the current saturation region, hereby increasing the response of the source followers, and their number may be changed in response to the threshold voltages of the MESFETs.

Other parts and components of the circuit which correspond to the circuit of FIG. 5 are designated by the same numerals as them, and the elucidations on them are omitted for simplicity of the explanation.

Figure 8:
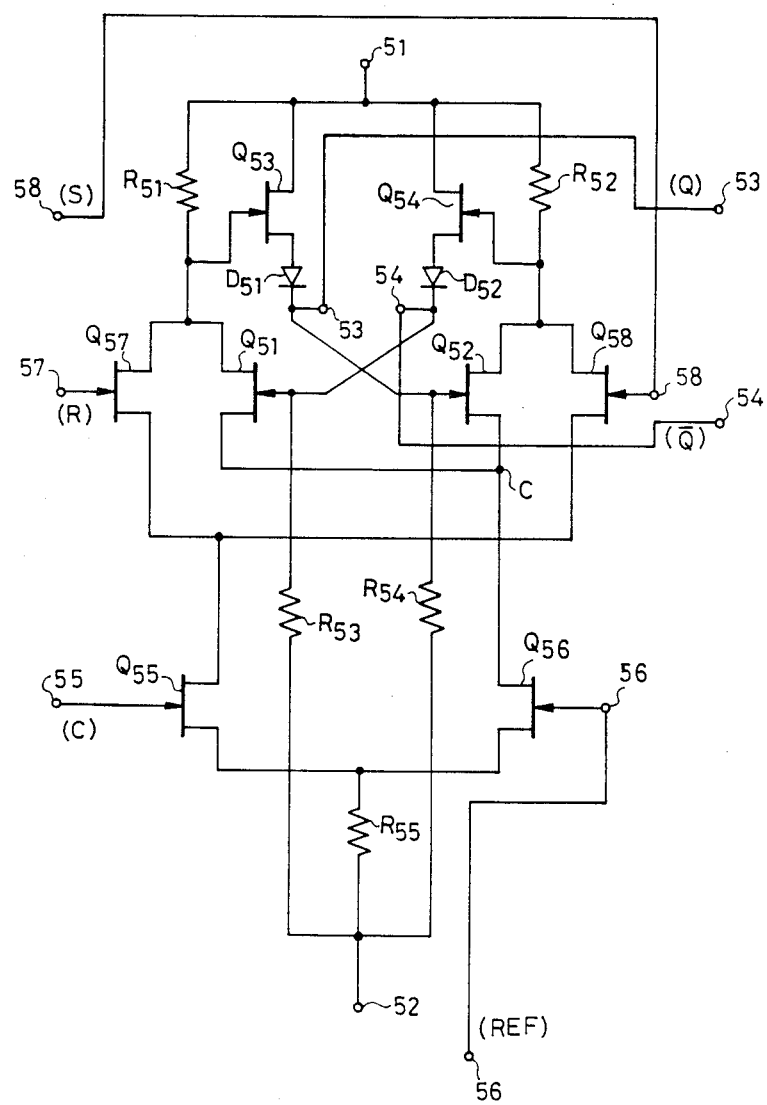
FIG. 8 is a circuit diagram of a clocked reset-set flip-flop embodying the present invention.

FIG. 8 shows a circuit diagram of a third example which is a clocked reset-set flip-flop using the latch of FIG. 5. In the circuit of FIG. 8, a MESFET $Q_{56}$ is connected by its drain to the common-connection point C, and by its gate to the reference input terminal 56. Another MESFET $Q_{55}$ is connected by its gate to a clock input terminal 55 and by its source commonly with the source of the MESFET $Q_{56}$ to the upper end of the current source means $R_{55}$. MESFETs $Q_{57}$ and $Q_{58}$ are common connected with their sources to the drain of the MESFET $Q_{55}$. The gate of the MESFET $Q_{57}$ is connected to a reset input terminal 57. The gate of the MESFET $Q_{58}$ is connected to a set input terminal 58, and drains of the MESFETs $Q_{57}$ and $Q_{58}$ are connected to the drains of MESFET $Q_{51}$ and $Q_{52}$, respectively. The output terminals 53 and 54 are led out to a positive phase Q terminal 53 and negative phase $\overline{Q}$ terminal 54, respectively. The resistors $R_{51}$ and $R_{52}$ serve as common-resistors for common drain connected MESFETs $Q_{51}$, $Q_{57}$ and the common drain connected MESFETs $Q_{52}$, $Q_{58}$, respectively.

Other parts and components of the circuit which correspond to the circuit of FIG. 5 are designated by the same numerals as them, and the elucidations on them are omitted for simplicity of the explanation.

Operation of flip-flop of FIG. 8 is described as follows. When clock input terminal 55 is of a higher potential than that of the reference voltage input terminal 56, then MESFETs $Q_{55}$ and $Q_{56}$ become on and off, respectively, and at that time when an "H" signal is added to either of the reset input terminal 57 or the set input terminal 58, then the MESFET $Q_{57}$ or $Q_{58}$ turns on, respectively. Then, when the clock input terminal 55 is of lower potential than that of the reference voltage input terminal 56, the MESFET $Q_{55}$ or $Q_{56}$ turns off or on, respectively. At the same time, MESFETs $Q_{51}$, $Q_{52}$, $Q_{53}$ and $Q_{54}$ form a latch circuit, and therefore, the above-mentioned state which is designated by the state at the reset input terminal 57 and set input terminal 58 are retained as it is. Then, this state is output from the output terminals 53 and 54.

This clocked reset-set flip-flop has such small power consumption as is substantially equal to that of the latch of FIG. 5, and the allowable margin to the deviation of the threshold voltage of the latch is reflected to this flip-flop. That is, in the operation of increasing or decreasing the on-current due to deviation of the threshold voltage, the voltage of the common-connected sources of the MESFETs $Q_{55}$ and $Q_{56}$ increases or decreases, bu the allowable range of the threshold voltage of this flip-flop are equal to those of the latch since the potential of the reference input terminal 56 can be selected so as to certainly turn on or off the MESFETs $Q_{55}$ and $Q_{56}$.

As has been elucidated, the clocked reset-set flip-flop using the MESFET circuit in accordance with the present invention is operable at a very low power consumption and can stably operate for a wide range of threshold voltage.

Figure 9:
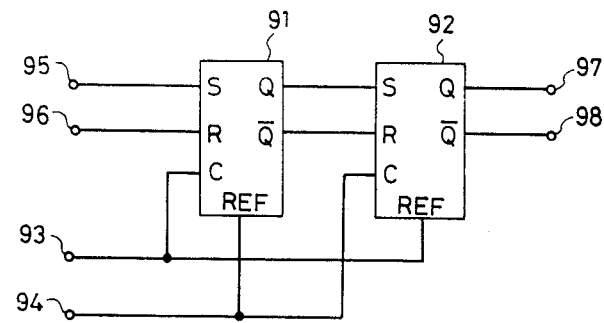
FIG. 9 is a block diagram of a clocked master-slave delay flip-flop embodying the present invention.

FIG. 9 is a circuit diagram of a master-slave delay flip-flop of single phase clocked type which comprises the reset-set flip-flop shown in FIG. 8. In the circuit of FIG. 9 the reset-set flip-flops 91 and 92 are a master flip-flop and a slave flip-flop, respectively. The set input terminal S, reset input terminal R, clock input terminal C, reference voltage input terminal REF, positive phase output terminal Q and negative phase output terminal $\overline{Q}$ correspond to the terminals 58, 57, 55, 56, 53 and 54, respectively. The first stage reset-set flip-flop 91 and the second stage reset-set flip-flop 92 are connected such that output terminals Q and $\overline{Q}$ of the former (91) are connected to the input terminals S and R of the latter (92), respectively, a clock input terminal C of the former (91) and a reference input terminal REF of the latter (92) are connected in common to a clock input terminal 93 of the composite circuit, a reference input terminal REF of the former (91) and a clock input terminal C of the latter (92) are connected in common to a first reference input terminal 94 of the composite circuit, a reset input terminal R of the former (91) is connected to a second reference input terminal 96, and a set input terminal S of the former (91) is connected to a set input terminal 95 of the composite circuit, output terminals Q and $\overline{Q}$ of the latter (92) being connected to the output terminals 97 and 98 of the composite circuit, respectively.

Operation of the master-slave flip-flop of FIG. 9 is described as follows.

When the potential of the clock input terminal 93 is higher than the potential of the first reference voltage input terminal 94, then in the master flip-flop 91 the input gates S nd R open and the signal at the set input terminal is compared with the signal at the second reference voltage input terminal 96. A positive phase output and a negative phase output from the output terminals Q and $\overline{Q}$ of the master flip-flop 91 are issued, respectively. On the other hand in the slave flip-flop 92, the input gates S and R are shut off. Next, when the clock input terminal 93 is of a lower potential than the first reference voltage input terminal 94, then in the master flip-flop 91 the input gates S and R are shut off, and instead the input gates S and R of the slave flip-flop 92 are opened so that the signal at the output terminals Q and $\overline{Q}$ of the master flip-flop 91 is led into the input terminals S and R of the slave flip-flop 92. Accordingly, the slave flip-flop 92 issues a positive phase output signal and a negative phase output signal to the output terminals 97 and 98, respectively.

In the above composite master-slave flip-flop circuit, in each of the flip-flops 91 and 92 a pair of the clock input terminal C and the reference voltage input terminal REF as well as the pair of set input terminal S and the reset input terminal R forms a differential input relation with respect to each other, and in each pair both inputs are compared to determine the input logic. Accordingly, by fixing one signal of the pair in a DC voltage relation, it is possible to operate the circuit with only a single phase signal. As a result for the clock input, only a single phase clock suffices. Furthermore, there is no need of adding an inverter to the input terminals S and R of the master flip-flop 91, and only simply impressing an input signal to the input terminals suffices. Accordingly, in the present circuit a clocked master-slave delay flip-flop can be constituted only with two reset-set flip-flop without using inverter, thereby decreasing of the area of the IC chip and lower power consumption is possible. Furthermore, by using only a single phase clock signal the master-slave flip-flop can be synchronized without delay, and accurate operation is possible even at a high speed operation.

In above-mentioned example, in place of the level shift diode $D_{51}$ and $D_{52}$ series connected multiple diodes may be used depending on the extent of the level to be shifted, thereby operation for a large pinch off voltage $V_p$ of MESFET can be possible.

As elucidated above, according to the present invention the master-slave flip-flop of a single phase clocked type can be realized with dispensing with the inverter hitherto necessitated, and thereby the size of the IC as well as power consumption can be decreased.

Figure 10:
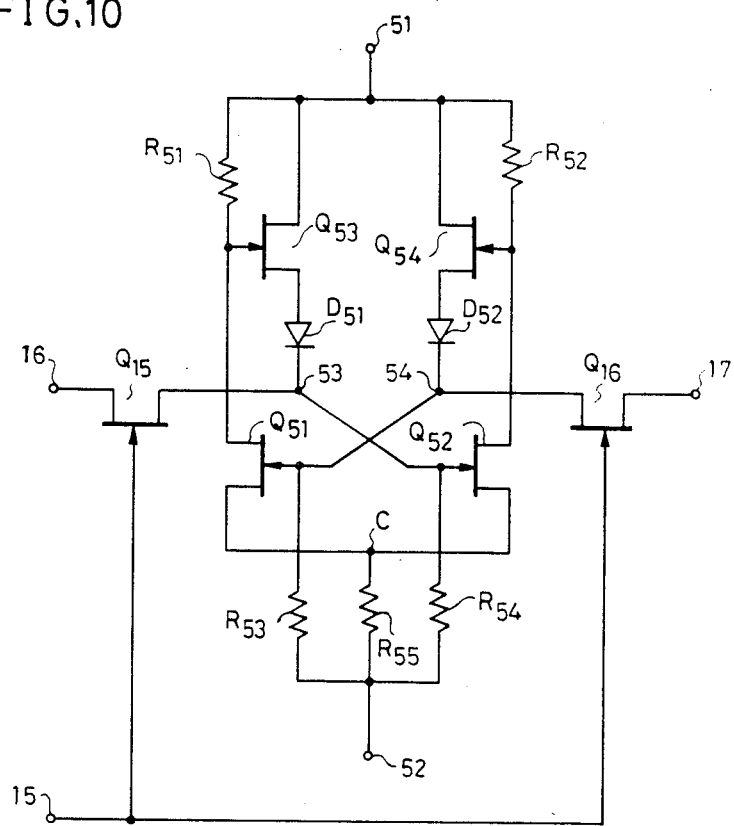
FIG. 10 is a circuit diagram of an example of a static RAM embodying the present invention.

FIG. 10 shows a static RAM constituted with the latch of FIG. 5. In this static RAM, a pair of MESFETs $Q_{15}$ and $Q_{16}$ are connected by their sources to the output terminals 53 and 54 of the latch of FIG. 5, respectively, and the gates of the MESFETs $Q_{15}$ and $Q_{16}$ are commonly connected to a control terminal 15. The drains of the MESFETs $Q_{15}$ and $Q_{16}$ are connected to write-in terminal 16 and 17, respectively.

Other parts and components of the circuit which correspond to the circuit of FIG. 5 are designated by the same numerals as them, and the elucidations on them are omitted for simplicity of the explanation.

Operation of static RAM of FIG. 10 is described as follows.

In order to write-in, a positive voltage is impressed on the control terminal 15, and a data signal is impressed either to the write-in terminal 16 or 17, thereby forcedly latching the MESFETs $Q_{51}$ and $Q_{52}$. Reading from this static RAM is made by impressing the control signal to the control terminal 15, and from the voltage state "H" or "L" of the terminals 16 and 17 the latch state is read out.

This static RAM has very small power consumption and can perform stable operation for a wide range of threshold voltage of MESFETs, for the power consumption and allowable range of the threshold voltage is substantially the same as that of the latch of FIG. 5.

Figure 11A:
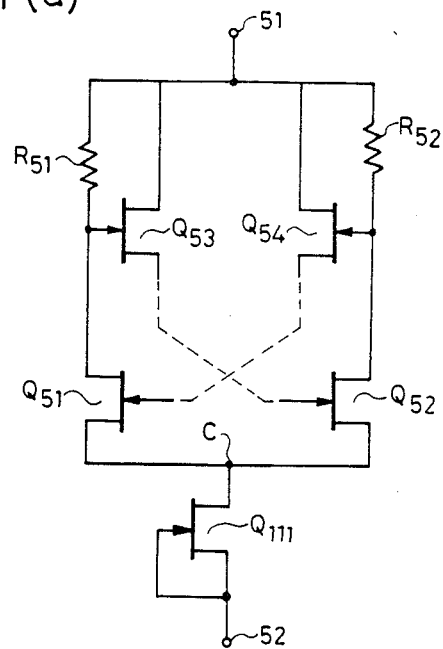
FIG. 11(a) is a circuit diagram of a part of a modification of the examples of the present invention.

The circuit configurations of FIG. 5, FIG. 7, FIG. 8 and FIG. 10 are not limited to the circuits shown thereof, but instead, their current source means $R_{55}$ can be replaced by active load, for instance, of drain-source impedance of the FET as shown in FIG. 11(a). By utilizing such active loads, the area necessitated on the IC can be decreased. Furthermore, such an active load has more superior constant current characteristic than the fixed resistors. Accordingly, by use of the active loads, the allowable range of the threshold voltage of MESFETs can be increased.

Figure 11B:
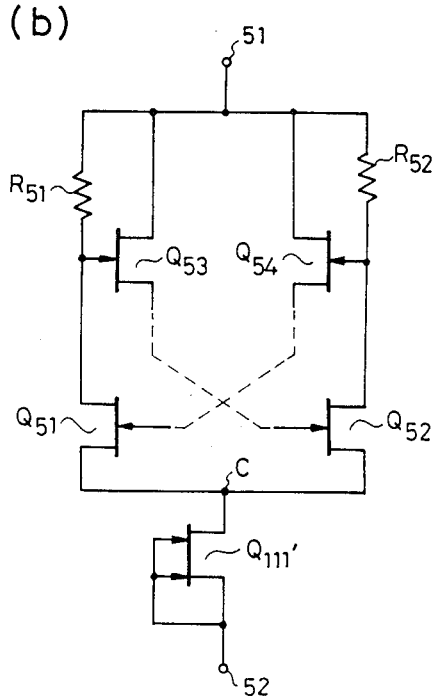
FIG. 11(b) is a circuit diagram of a part of a modification of the examples of the present invention.

FIG. 11(b) shows a further improved example where as the current source means is used a dual gate FET connected with both of its gates to the source. Since the dual gate FET has a more superior constant current characteristic than a single gate FET, the circuit FIG. 11(b) wherein the dual gate FET $Q_{111}$, is connected with their dual gates to the source to serve as current source means $R_{55}$ can perform more by a superior characteristic that FIG. 11(a).

Figure 12:
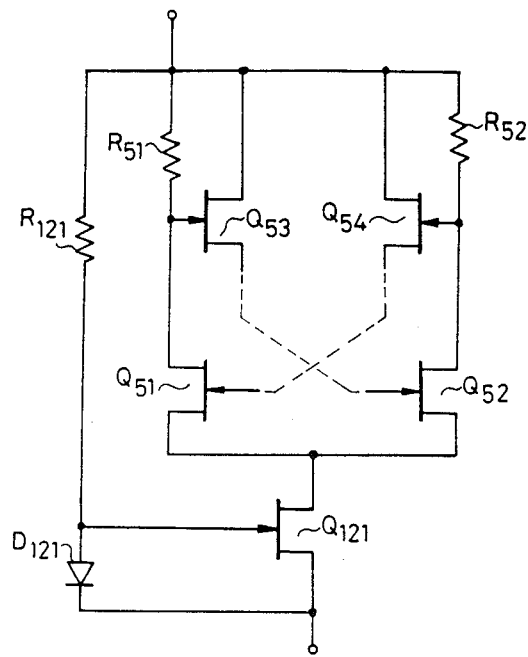
FIG. 12 is a circuit diagram of a part of a modification of the examples of the present invention.

FIG. 12 shows a further improved circuit of the present invention wherein as the current source means, source-and-drain circuit of a FET $Q_{121}$ is utilized and the gate of the FET $Q_{121}$ is connected to a junction point of a series connection of a resistor $R_{121}$ and diode $D_{121}$, which series connection is connected between the positive side power supply terminal 51 and the negative side power supply terminal 52. In the circuit of FIG. 12, the gate source circuit of the FET $Q_{121}$ is forward biased, and on-current flows through the FET $Q_{121}$. According to the circuit configuration of FIG. 12, for the FET $Q_{121}$, a normally-off type FET can be used. Accordingly, there is no need of comprising normally-off type FETs and normally-on type FETs to constitute the latch, and accordingly, manufacturing process becomes simple.

In the modified examples of FIG. 11(a), FIG. 11(b) and FIG. 12, other parts and components of the circuit which correspond to the circuit of FIG. 5 are designated by the same numerals as them or omitted from the drawing for simplicity, and the elucidations on them are omitted for simplicity of the explanation.

As has been elucidated with respect to many examples, the present invention is characterized by a latch circuit or its application with insertion of a current source means between common-connection point C and the negative side powers supply terminal 52.

It is naturally to be understood that, though in the examples a positive power supply voltage $V_{DD}$ is impressed to the terminal 51 and the negative side power supply terminal is grounded, of course it is possible that the terminal 51 is grounded and the terminal 52 is connected to a negative power supply voltage. That is, it is only necessary that the terminal 51 is connected to a higher voltage with respect to the terminal 52.

What is claimed is:

1. An FET circuit comprising:
   a pair of inverters, each inverter comprising:
   an output terminal,
   resistive means,
   a first FET having drain, gate and source electrodes and having its drain electrode connected through said resistive means to a first power supply terminal, its gate electrode connected to said output terminal of the other said inverter and its source electrode connected to a first common connection point, and
   a second FET having drain, gate and source electrodes and having its drain electrode connected to the drain electrode of said first FET, its gate electrode connected to one of a set terminal and reset terminal and its source electrode connected to a second common connection point;
   said pair of inverters comprising a third FET having drain, gate and source electrodes and having its drain electrode connected to said first common connection point and its gate electrode connected to a reference voltage terminal, and a fourth FET having drain, gate and source electrodes and having its drain electrode connected to said second common connection point, its gate electrode connected to a clock terminal and its source electrode connected to the source electrode of the third FET at a third common connection point; and
   substantially constant current source means connected between said third common connection point and a second power supply terminal.

2. An FET circuit in accordance with claim 1, wherein said second power supply terminal is connected to reference ground potential.

3. An FET circuit in accordance with claim 1, wherein said current source means is a resistor.

4. An FET circuit in accordance with claim 1, wherein said substantially constant current source means is a source-drain circuit of another FET.

5. An FET circuit in accordance with claim 4, wherein a gate electrode of said another FET is connected to its source electrode.

6. An FET circuit in accordance with claim 5, wherein said substantially constant current source means is a dual gate FET having two gate electrodes connected to its source electrode.

7. An FET circuit in accordance with claim 1, wherein said FETs are Schottky barrier gate FETs.

8. An FET circuit comprising: a pair of inverters, each inverter comprising:
  an output terminal,
  resistive means,
  a first FET having drain, gate and source electrodes and having its drain electrode connected through said resistive means to a first power supply terminal, its gate electrode connected to said output terminal of the other said inverter and its source electrode connected to a first common connection point, and
  a second FET having drain, gate and source electrodes and having its drain electrode connected to the drain electrode of said first FET, its gate electrode connected to one of a set terminal and reset terminal and its source electrode connected to a second common connection point;
  said pair of inverters comprising a third FET having drain, gate and source electrodes and having its drain electrode connected to said first common connection point and its gate electrode connected to a reference voltage terminal, and a fourth FET having drain, gate and source electrodes and having its drain electrode connected to said second common connection point, its gate electrode connected to a clock terminal and its source electrode connected to the source electrode of the third FET at a third common connection point;
  each said inverter further comprising diode means and a fifth FET having a gate electrode connected to the drain electrode of the first FET of the same inverter, a source electrode connected through said diode means to the output terminal of the same inverter and a drain electrode connected to said first power supply terminal; and
  substantially constant current source means connected between said third common connection point and a second power supply terminal.

9. An FET circuit in accordance with claim 8, wherein said second FETs are of the normally ON type.

10. An FET circuit in accordance with claim 8, wherein said second and third power supply terminals are common.

11. An FET circuit in accordance with claim 10, wherein said second FETs are of the normally ON type.

* * * * *

UNITED STATES PATENT AND TRADEMARK OFFICE
CERTIFICATE OF CORRECTION

PATENT NO. : 4,883,985

DATED : November 28, 1989

INVENTOR(S) : KATSU, Shin-ichi, et al.

It is certified that error appears in the above-identified patent and that said Letters Patent is hereby corrected as shown below:

In the heading:

Correct the name of the first-listed inventor to read:

[75] Inventors: Shin-ichi Katsu, Takatsuki;
Shutaro Nambu, Ibaraki;
Akio Shimano, Osaka, all of Japan Signed and Sealed this Eighteenth Day of December, 1990

Attest:

HARRY F. MANBECK, JR.

*Attesting Officer*     *Commissioner of Patents and Trademarks*